(12) United States Patent
Kim

(10) Patent No.: US 7,573,338 B2
(45) Date of Patent: Aug. 11, 2009

(54) QUADRATURE VOLTAGE CONTROLLED OSCILLATOR WITH AUTOMATED PHASE CONTROL

(75) Inventor: Young-Jin Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 780 days.

(21) Appl. No.: 11/133,787

(22) Filed: May 20, 2005

(65) Prior Publication Data

US 2005/0281356 A1    Dec. 22, 2005

(30) Foreign Application Priority Data

Jun. 16, 2004   (KR) .................. 10-2004-0044515

(51) Int. Cl.
*H03B 27/00* (2006.01)
(52) U.S. Cl. .......................... 331/45; 331/74; 327/148; 327/254; 375/345; 375/324; 455/260
(58) Field of Classification Search ............... 331/57, 331/167, 74, 45; 327/148, 254; 455/260; 375/345, 324; 329/304
See application file for complete search history.

(56) References Cited

U.S. PATENT DOCUMENTS

| 5,418,497 | A | 5/1995 | Martin | 331/48 |
| 6,456,167 | B1 | 9/2002 | Huang | 331/46 |
| 6,462,626 | B1 | 10/2002 | Gharpurey | 331/108 |
| 6,549,082 | B2 * | 4/2003 | Ipek et al. | 331/57 |

OTHER PUBLICATIONS

Japanese Patent Publication No. 2000-138530 to Ranjit, having Publication date of May 16, 2000 (w/ English Abstract page).
Japanese Patent Publication No. 02-279004 to Nobukazu et al., having Publication date of Nov. 15, 1990 (w/ English Abstract page).
Korean Patent Publication No. 100201815 to Park, having Publication date of Mar. 16, 1999 (w/ English Abstract page).

* cited by examiner

*Primary Examiner*—Arnold Kinkead
(74) *Attorney, Agent, or Firm*—Monica H. Choi

(57) ABSTRACT

A quadrature voltage controlled oscillator includes oscillation circuits for generating in-phase and quadrature-phase oscillation signals that are used to generate in-phase and quadrature-phase output signals. A compensation circuit adjusts biasing in the oscillation circuits depending on a phase relationship between the in-phase and quadrature-phase output signals to automatically control the phase relationship between the oscillation signals.

18 Claims, 6 Drawing Sheets

QUADRATURE VOLTAGE CONTROLLED OSCILLATOR WITH AUTOMATED PHASE CONTROL

BACKGROUND OF THE INVENTION

This application claims priority under 35 USC § 119 to Korean Patent Application No. 2004-44515, filed on Jun. 16, 2004, the contents of which are herein incorporated by reference in their entirety for all purposes.

1. Field of the Invention

The present invention relates generally to wireless receivers, and in particular to a quadrature voltage controlled oscillator used within a wireless receiver for generating oscillation signals with automated phase control.

2. Description of the Related Art

FIG. 1 shows a conventional wireless receiver as disclosed in U.S. Pat. No. 6,462,626 entitled "Quadrature Output Oscillator Device". Referring to FIG. 1, the conventional receiver includes an antenna 12 for receiving an RF (radio frequency) signal. The RF signal is filtered by a filter 14 and amplified by an amplifier 16.

The filtered and amplified RF signal is then applied to a first mixer 18 and a second mixer 20 of a first mixing stage 21. The first mixer 18 uses an in-phase oscillation signal Ia generated by a first quadrature voltage controlled oscillator 22. The second mixer 20 uses a quadrature-phase oscillation signal Qa generated by the first quadrature voltage controlled oscillator 22.

An output of the first mixer 18 is provided to a third mixer 24 and a fourth mixer 26 of a second mixing stage 27. The third mixer 24 uses an in-phase oscillation signal Ib generated by a second quadrature voltage controlled oscillator 29, and the fourth mixer 26 uses a quadrature-phase oscillation signal Qb generated by the second quadrature voltage controlled oscillator 29.

The second mixer 20 generates an output provided to a fifth mixer 28 and a sixth mixer 30. The fifth mixer 28 uses the in-phase oscillation signal Ib, and the sixth mixer 30 uses the quadrature-phase oscillation signal Qb. Outputs of the third and sixth mixers 24 and 30 are provided to a selector 32 that generates an in-phase representation IFI of the RF signal. Outputs of the fourth and fifth mixers 26 and 28 are provided to a selector 34 that generates a quadrature-phase representation IFQ of the RF signal. Depending on the phases of the oscillation signals applied to the various mixers, a desired down-converted signal is obtained with the selector 32 acting as an adder and the selector 34 acting as a subtractor, or vice versa, with the selector 32 acting as a subtractor and the selector 34 acting as an adder.

The second quadrature voltage controlled oscillator 29 generates oscillation signals at a much lower frequency, compared to the first quadrature voltage controlled oscillator 22. For example, the frequency of the RF signal received at the antenna 12 is around 1.9 GHz. The frequency of the oscillation signals generated by the first quadrature voltage controlled oscillator 22 is in a range from about 1.5 to about 1.7 GHz. The second quadrature voltage controlled oscillator 29 generates oscillation signals with a difference frequency between the frequency of the RF signal received at the antenna 12 and the frequency of oscillation signals generated by the first quadrature voltage controlled oscillator 22. For example, the difference frequency is in a range from about 200 MHz to about 400 MHz.

The mixers within the receiver of FIG. 1 are used to down-convert the frequency of the RF signal received at the antenna 12 to an intermediate frequency. An image signal has a frequency lower than the oscillation frequency. The image signal is down-converted to the same intermediate frequency as the received radio signal. The down-converted image signal may interfere with the desired down-converted radio signal and degrade the receiver's performance.

To reject the image signal, extra image-rejection filters may be used before the mixers. However, integration of such extra filters on to the same circuit as the receiver in FIG. 1 is difficult. Therefore, the mixers within the receiver are used here to eliminate the down-converted image signal. The quality of the mixers is determined by a quadrature phase relationship between oscillation signals generated by the first quadrature voltage controlled oscillator 22. For example, the down-converted image signal may not be completely eliminated without a precise quadrature relationship between the in-phase component I and the quadrature phase component Q generated by the first quadrature voltage controlled oscillator 22.

FIG. 2 shows a block diagram of a quadrature voltage controlled oscillator as disclosed in U.S. Pat. No. 6,456,167 entitled "Quadrature Oscillator". Referring to FIG. 2, the conventional quadrature voltage controlled oscillator includes a first oscillation circuit 100, a second oscillation circuit 200, and current sources I1 and I2. In-phase components IP and IN output from the first oscillation circuit 100 are applied to input terminals of the second oscillation circuit 200. Quadrature components QP and QN output from the second oscillation circuit 200 are applied to input terminals of the first oscillation circuit 100, respectively. The in-phase components IP and IN and quadrature components QP and QN are applied to mixers 18 and 20 in the receiver of FIG. 1 for example.

However, the in-phase components of the voltage controlled oscillator may not have an ideal quadrature relationship with the quadrature-phase components. That is, a phase difference between the in-phase components and the quadrature-phase components may be 90°+ERR, with ERR being an error component. Such an error in the phase difference is mainly due to device mismatch in the voltage controlled oscillator. With such an error, a passive filter may be used to reject the resulting image signal from the received radio frequency in a receiver. However, such a passive filter within the receiver complicates the design and increases the chip size of the receiver.

Therefore, the quadrature voltage controlled oscillator needs to be precisely controlled so that the in-phase signal and the quadrature-phase signal have the proper quadrature relationship for desired receiver performance. U.S. Pat. No. 6,462,626 discloses a quadrature oscillator device that controls a gain of an amplifier.

In U.S. Pat. No. 6,462,626, an amplifying ratio of the amplifier in the quadrature oscillator device is controlled for a precise quadrature relationship between an in-phase signal component I and a quadrature phase signal component Q. However, such a gain adjustment may be manual after measurement of the in-phase and quadrature signal components I and Q. Such manual adjustment may be time-consuming and prone to error. Thus, an efficient and accurate mechanism for automatically controlling the quadrature relationship between the in-phase and quadrature signal components I and Q is desired.

SUMMARY OF THE INVENTION

Accordingly, the present invention automatically controls the quadrature phase relationship between oscillation signals generated by a quadrature voltage controlled oscillator within a receiver.

In an aspect of the present invention, a quadrature voltage controlled oscillator includes oscillation circuits for generating at least one in-phase oscillation signal and at least one quadrature-phase oscillation signal that are used to generate an in-phase output signal and a quadrature-phase output signal. In addition, a compensation circuit adjusts biasing in the oscillation circuits depending on a phase relationship between the in-phase and quadrature-phase output signals.

The quadrature voltage controlled oscillator may be used to particular advantage within a wireless receiver that mixes the in-phase and quadrature-phase oscillation signals with an RF (radio frequency) signal to generate the in-phase and quadrature-phase output signals.

In an exemplary embodiment of the present invention, the biasing in the oscillation circuits is adjusted by the compensation circuit to set a phase difference between the in-phase and quadrature-phase output signals to be substantially 90°.

In another exemplary embodiment of the present invention, the oscillation circuits include a first oscillation circuit for generating differential in-phase oscillation signals and a second oscillation circuit for generating differential quadrature-phase oscillation signals.

In a further exemplary embodiment of the present invention, the quadrature voltage controlled oscillator further includes a first current source that generates a first bias current for the first oscillation circuit and a second current source that generates a second bias current for the second oscillation circuit. In that case, the compensation circuit adjusts the first and second bias currents. For example, the first and second bias currents are adjusted complimentarily.

In yet another exemplary embodiment of the present invention, the compensation circuit includes a phase mismatch detector that determines a phase difference between the in-phase and quadrature-phase output signals. The first and second bias currents are adjusted complimentarily until the phase difference between the in-phase and quadrature-phase output signals is substantially 90°.

In this manner, the phase relationship between the oscillation signals generated by the oscillation circuits is automatically controlled by monitoring the phase relationship between the resulting in-phase and quadrature-phase output signals.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, and 7 refer to elements having similar structure and/or function.

DETAILED DESCRIPTION OF THE INVENTION

Figure 1:
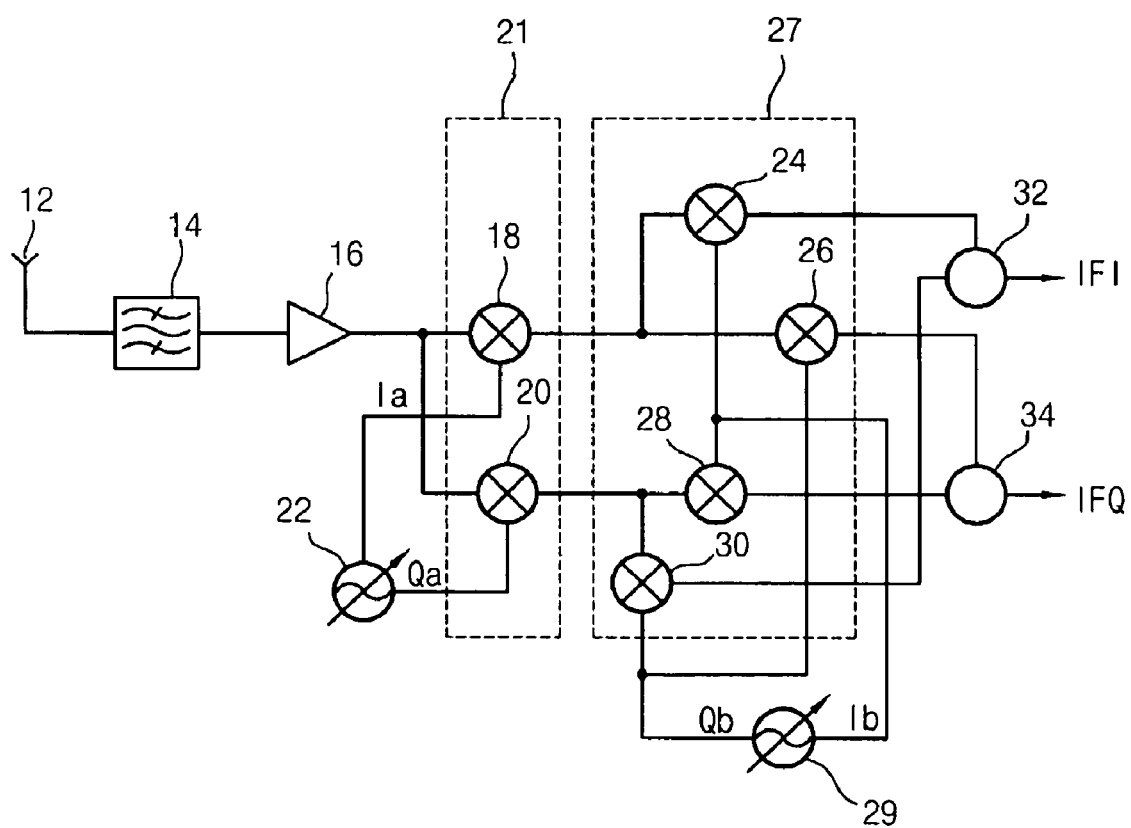
FIG. 1 shows a wireless receiver of the prior art.
Figure 2:
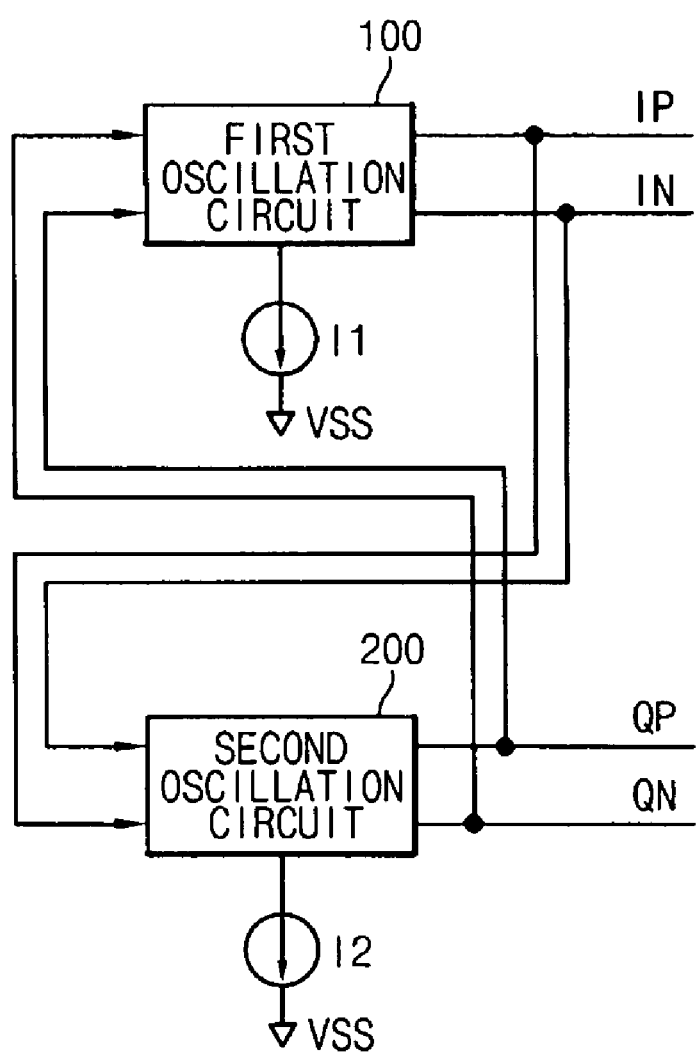
FIG. 2 shows a block diagram of a conventional quadrature voltage controlled oscillator of the prior art.
Figure 3:
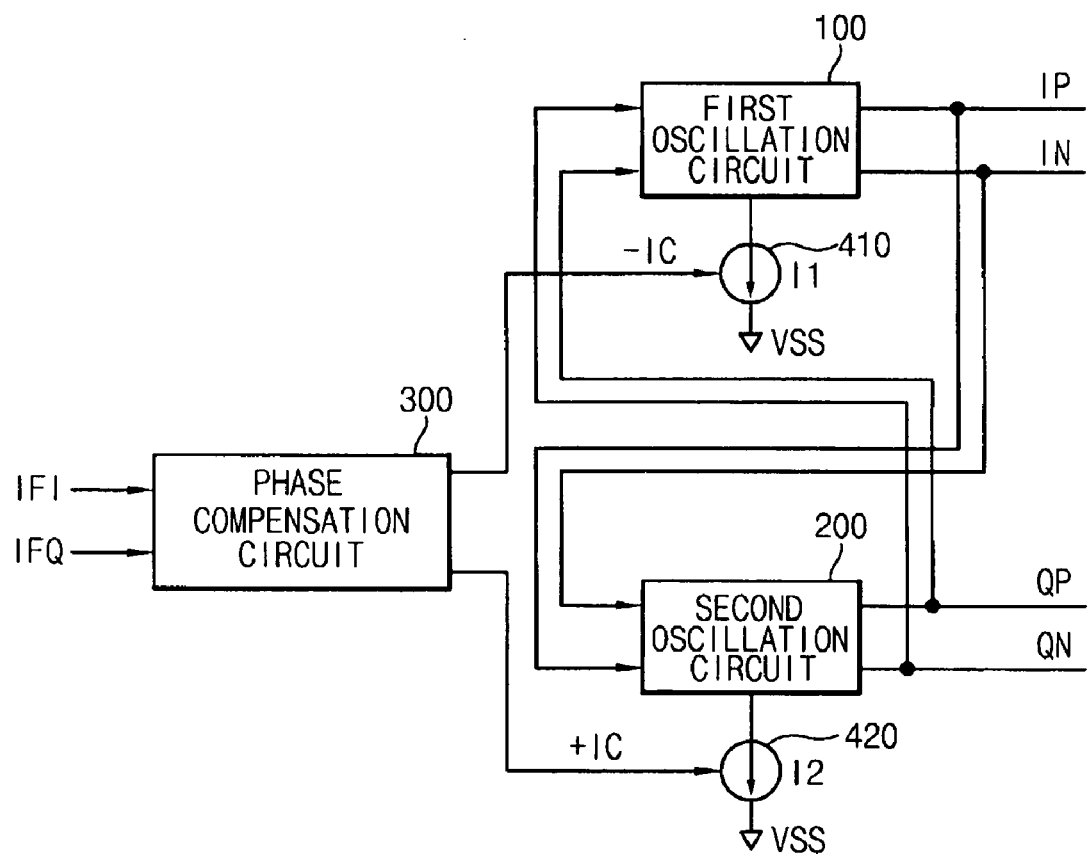
FIG. 3 shows a block diagram of a quadrature voltage controlled oscillator according to an exemplary embodiment of the present invention.

FIG. 3 shows a block diagram of a quadrature voltage controlled oscillator according to an exemplary embodiment of the present invention. Referring to FIG. 3, the quadrature voltage controlled oscillator includes a phase compensation circuit 300, a first oscillation circuit 100, a first current source 410, a second oscillation circuit 200, and a second current source 420.

The phase compensation circuit 300 receives an in-phase output signal IFI and a quadrature-phase output signal IFQ to detect a level of deviation from a desired phase difference (such as 90° for example) between the in-phase and quadrature-phase output signals IFI and IFQ. Additionally, the phase compensation circuit 300 generates first and second compensation signals −IC and +IC based on the phase deviation for complementarily controlling first and second bias currents I1 and I2.

The first oscillation circuit 100 receives quadrature-phase oscillation signals QP and QN from the second oscillation circuit 200 to generate in-phase oscillation signals IP and IN. The first current source 410 provides the first bias current I1 to the first oscillation circuit 100 in response to the first compensation signal −IC. The second oscillation circuit receives the in-phase oscillation signals IP and IN from the first oscillation circuit 100 to generate the quadrature-phase oscillation signals QP and QN. The second current source 420 provides the second bias current I2 to the second oscillation circuit 200 in response to the second compensation signal +IC.

The in-phase and quadrature-phase output signals IFI and IFQ are generated by mixing the in-phase and quadrature phase oscillation signals IP, IN, QP, and QN with an RF (radio frequency) signal such as within a wireless RF receiver for example. The in-phase oscillation signals IP and IN are generated as differential signals in the first oscillation circuit 100, and the quadrature-phase oscillation signals QP and QN are generated as differential signals in the second oscillation circuit 200.

Figure 4:
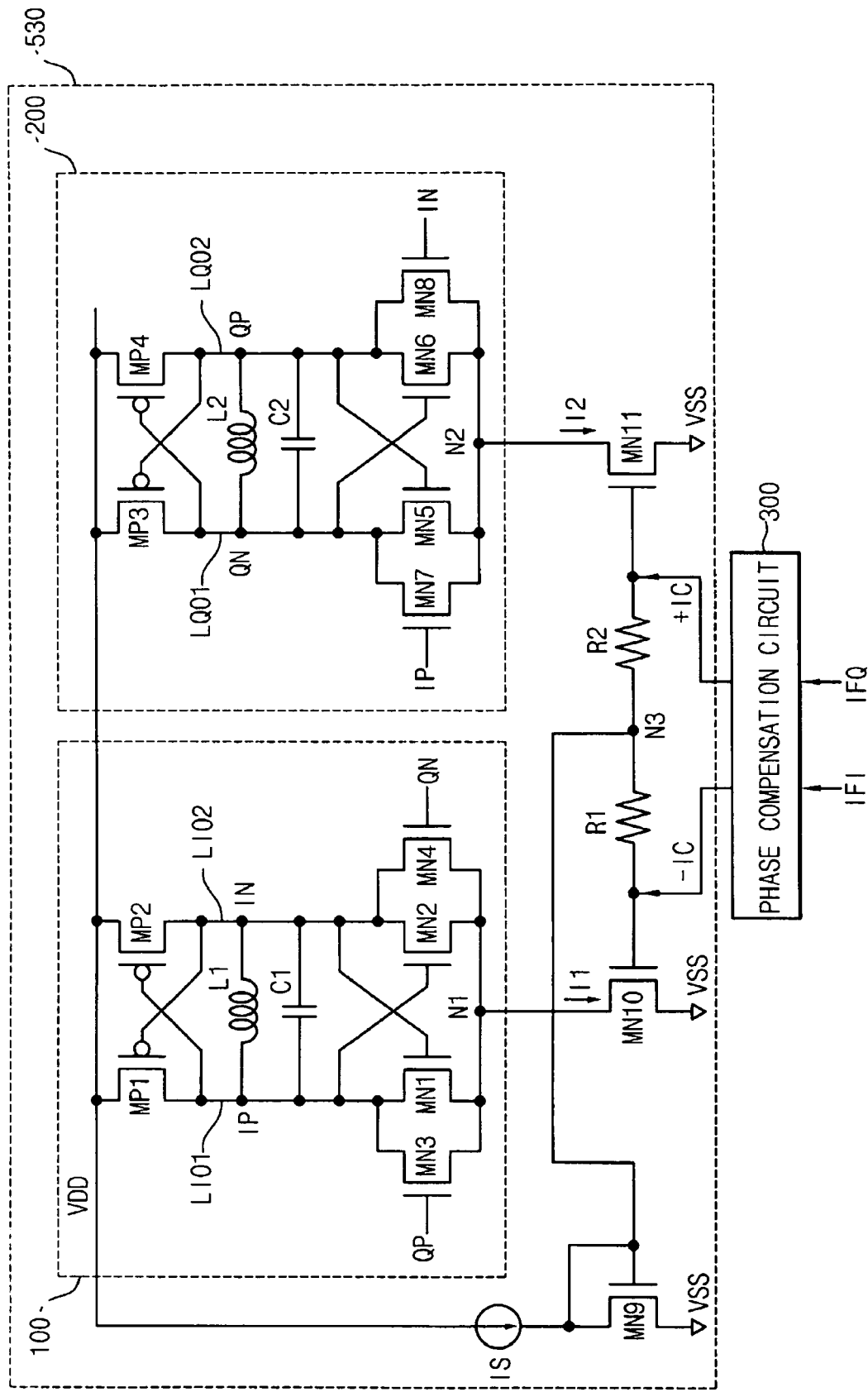
FIG. 4 shows a circuit diagram of the quadrature voltage controlled oscillator according to an exemplary embodiment of the present invention.

FIG. 4 shows a circuit diagram of the quadrature voltage controlled oscillator of FIG. 3 according to an exemplary embodiment of the present invention. Referring to FIG. 4, the quadrature voltage controlled oscillator includes a local oscillator 530 and a phase compensation circuit 300. The local oscillator 530 includes the first oscillation circuit 100, the second oscillation circuit 200, a current source IS, a first NMOSFET (N-channel metal oxide semiconductor field effect transistor) MN9, a second NMOSFET MN10, and a third NMOSFET MN11.

The second NMOSFET MN10 forms the first current source providing the first bias current I1 for biasing the first oscillation circuit 100. Similarly, the third NMOSFET MN11 forms the second current source providing the second bias current I2 for biasing the second oscillation circuit 200.

The first oscillation circuit 100 includes PMOSFETs (P-channel metal oxide semiconductor field effect transistors) MP1 and MP2, an inductor L1, a capacitor C1, and NMOSFETs MN1, MN2, MN3 and MN4. The in-phase oscillation signals IP and IN are generated as differential signals at first and second in-phase output lines LI01 and LI02, respectively.

The PMOSFET MP1 has a source coupled to a high supply voltage VDD, a drain coupled to the first in-phase output line LI01, and a gate coupled to the second in-phase output line LI02. The PMOSFET MP2 has a source coupled to the high supply voltage VDD, a drain coupled to the second in-phase output line LI02, and a gate coupled to the first in-phase output line LI01. The inductor L1 and the capacitor C1 are coupled in parallel between the first and second in-phase output lines LI01 and LI02.

The NMOSFET MN1 has a drain coupled to the first in-phase output line LI01, a source coupled to a first node N1, and a gate coupled to the second in-phase output line LI02. The NMOSFET MN2 has a drain coupled to the second in-phase output line LI02, a source coupled to the first node N1, and a gate coupled to the first in-phase output line LI01. The NMOSFET MN3 has a drain coupled to the first in-phase output line LI01, a source coupled to the first node N1, and a gate receiving a quadrature-phase oscillation signal QP. The NMOSFET MN4 has a drain coupled to the second in-phase output line LI02, a source coupled to the first node N1, and a gate receiving a quadrature-phase oscillation signal QN.

The second oscillation circuit 200 includes PMOSFETs MP3 and MP4, an inductor L2, a capacitor C2, and NMOSFETs MN5, MN6, MN7 and MN8. The quadrature-phase oscillation signals QN and QP are generated as differential signals at first and second quadrature-phase output lines LQ01 and LQ02, respectively.

The PMOSFET MP3 has a source coupled to the high supply voltage VDD, a drain coupled to the first quadrature-phase output line LQ01, and a gate coupled to the second quadrature-phase output line LQ02. The PMOSFET MP4 has a source coupled to the high supply voltage VDD, a drain coupled to the second quadrature-phase output line LQ02, and a gate coupled to the first quadrature-phase output line LQ01. The inductor L2 and the capacitor C2 are coupled in parallel between the first and second quadrature-phase output lines LQ01 and LQ02.

The NMOSFET MN5 has a drain coupled to the first quadrature-phase output line LQ01, a source coupled to a second node N2, and a gate coupled to the second quadrature-phase output line LQ02. The NMOSFET MN6 has a drain coupled to the second quadrature-phase output line LQ02, a source coupled to the second node N2, and a gate coupled to the first quadrature-phase output line LQ01. The NMOSFET MN7 has a drain coupled to the first quadrature-phase output line LQ01, a source coupled to the second node N2, and a gate receiving an in-phase signal IP. The NMOSFET MN8 has a drain coupled to the second quadrature-phase output line LQ02, a source coupled to the second node N2, and a gate receiving an in-phase signal IN.

The second NMOSFET MN10 has a drain coupled to the first node N1 and a source coupled to a low supply voltage VSS. The supply voltage VSS may be a negative voltage or a ground voltage. The third NMOSFET MN11 has a drain coupled to the second node N2 and a source coupled to the low supply voltage VSS. A first resistor R1 is connected between a gate of the second NMOSFET MN10 and a third node N3, and a second resistor R2 is connected between a gate of the third NMOSFET MN11 and the third node N3.

The current source IS and the first NMOSFET MN9 that is diode-connected partially bias the second and third NMOSFETs MN10 and MN11. The third node N3 is coupled to the diode connection of the first NMOSFET MN9. The current source IS is connected between the high supply voltage VDD and the third node N3. The diode-connected first NMOSFET MN9 is connected between the third node N3 and the low supply voltage VSS.

The phase compensation circuit 300 receives the in-phase and quadrature-phase output signals IFI and IFQ to detect a level of deviation from a desired phase difference (such as 90° for example) between the phases of the in-phase and quadrature-phase output signals IFI and IFQ. In addition, the phase compensation circuit 300 produces first and second compensation signals −IC and +IC in response to the phase deviation. The first and second compensation signals −IC and +IC are differential signals for complementarily adjusting the first and second bias currents I1 and I2. A first control current +IC is applied to a gate of the third NMOSFET MN11 and a second control current −IC is applied to a gate of the second NMOSFET MN10.

The operation of the quadrature voltage controlled oscillator of FIGS. 3 and 4 is now described. The first oscillation circuit 100 receives quadrature-phase oscillation signals QP and QN through the gates of the NMOSFETs MN3 and MN4. The inductor L1 and the capacitor C1 form a resonant tank causing the first oscillation circuit 100 to resonate. As a result, the first in-phase oscillation signal IP is outputted from the first in-phase output line LI01, and the second in-phase oscillation signal IN is outputted from the second in-phase output line LI02.

The second oscillation circuit 200 receives the in-phase oscillation signals IP and IN through the gates of the NMOSFETs MN7 and MN8. The inductor L2 and the capacitor C2 form a resonant tank causing the second oscillation circuit 200 to resonate. As a result, a first quadrature-phase oscillation signal QN is outputted from the first quadrature-phase output line LQ01, and a second quadrature-phase oscillation signal QP is outputted from the second quadrature-phase output line LQ02.

Figure 5:
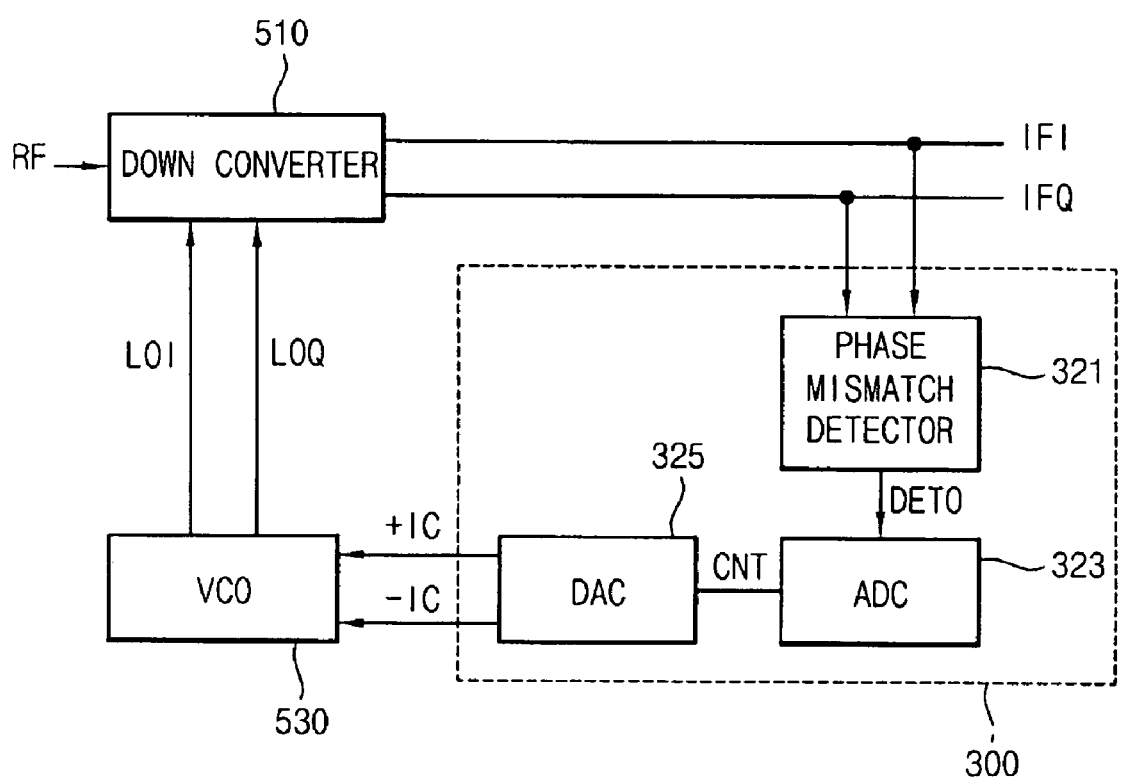
FIG. 5 shows a block diagram of a wireless receiver having the quadrature voltage controlled oscillator of FIG. 3 according to an exemplary embodiment of the present invention.

FIG. 5 shows a block diagram of a wireless receiver having the quadrature voltage controlled oscillator of FIGS. 3 and 4 according to an exemplary embodiment of the present invention. Referring to FIG. 5, the wireless receiver includes a down converter 510, a phase compensation circuit 300, and a local oscillator 530. The down converter 510 receives an RF (radio frequency) signal and generates an intermediate in-phase output signal IFI and an intermediate quadrature-phase output signal IFQ by mixing the received RF signal and oscillation frequencies LOI and LOQ from the local oscillator 530. The oscillation frequency LOI includes the first and second in-phase oscillation signals IP and IN, and the oscillation frequency LOQ includes the first and second quadrature-phase oscillation signals QN and QP.

The phase compensation circuit 300 detects a level of deviation from a desired phase difference (such as 90° for example) between the phases of the in-phase and quadrature-phase output signals IFI and IFQ to generate the complementary compensation signals +IC and −IC. The local oscillator 530 generates the in-phase and quadrature-phase frequencies in response to the complementary compensation signals +IC and −IC. The phase compensation circuit 300 includes a phase mismatch detector 321, an analog-to-digital (A/D) converter 323, and a digital-to-analog (D/A) converter 325.

The operation of the wireless receiver of FIG. 5 is now described. The down converter 510 receives the RF signal and generates the intermediate in-phase output signal IFI and the intermediate quadrature-phase output signal IFQ by mixing the received RF signal and the oscillation frequencies LOI and LOQ from the local oscillator 530. The phase mismatch detector 321 compares a phase of the intermediate in-phase output signal IFI with a phase of the intermediate quadrature-phase output signal IFQ. The phase mismatch detector 321 generates a detection signal DETO that indicates the level of deviation from a desired phase difference (such as 90° for example) between the phases of the in-phase and quadrature-phase output signals IFI and IFQ.

The analog-to-digital converter 323 converts the detection signal DETO to a digital control signal CNT having a digital value. The digital-to-analog converter 325 generates a first current −IC and a second current +IC based on the digital control signal CNT and transmits the first and second currents −IC and +IC to the local oscillator 530. In one embodiment of the present invention, the first and second currents −IC and +IC are differential currents such that the current +IC is sourced to the local oscillator 530 via a first terminal and the current −IC is sunk from the local oscillator 530 via a second terminal.

Figure 6:
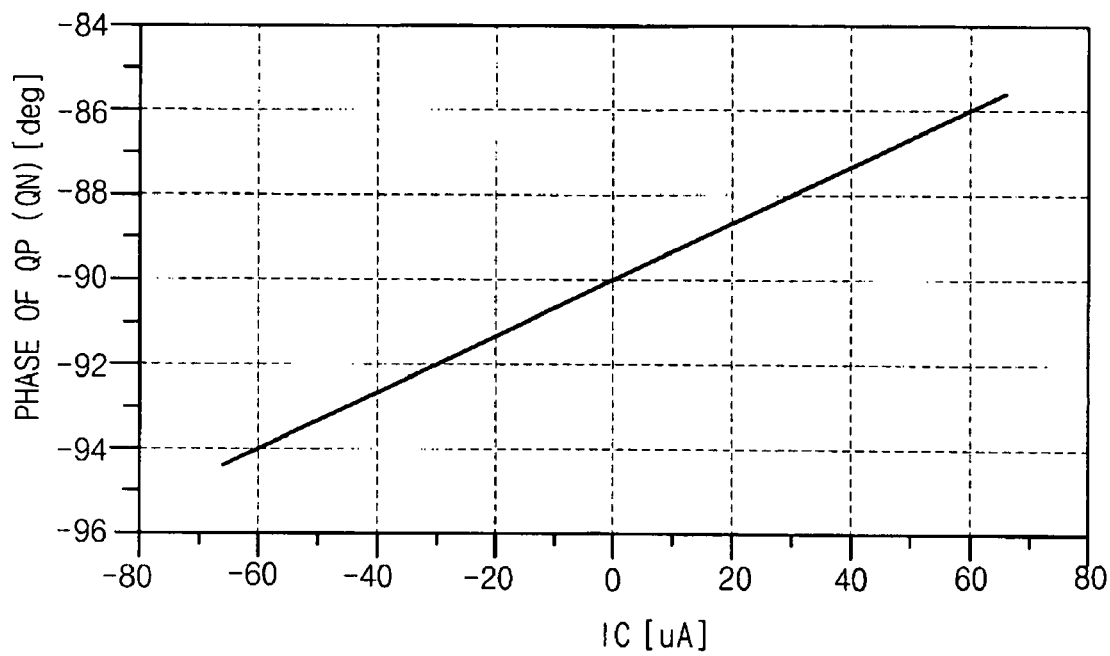
FIG. 6 shows a graph of a simulation result for phase variation of a quadrature-phase oscillation signal of the quadrature voltage controlled oscillator of FIG. 4.

FIG. 6 shows a simulated graph of a phase variation of a quadrature-phase output signal of the quadrature voltage controlled oscillator of FIG. 4 versus the magnitude of the compensation current IC. Referring to FIG. 6, the phase of the quadrature-phase output signal QP (or QN) varies substantially linearly with the compensation current IC. Thus, the compensation current IC from the D/A converter 325 in the phase compensation circuit 300 of FIG. 5 is adjusted to vary the phase difference between the quadrature-phase oscillation signals QP and QN of the voltage controlled oscillator.

Figure 7:
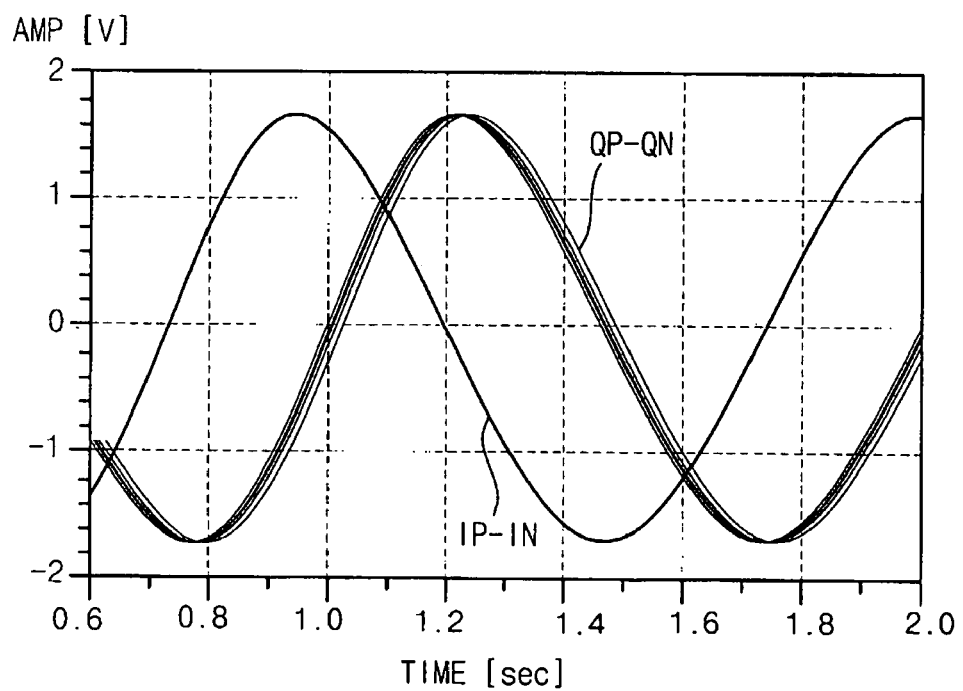
FIG. 7 shows a graph of simulation results for in-phase and quadrature-phase oscillation signals of the quadrature voltage controlled oscillator of FIG. 4.

FIG. 7 shows a simulated graph of the in-phase and quadrature-phase oscillation signals of the quadrature voltage controlled oscillator of FIG. 4. Referring to FIG. 7, the phases of the quadrature-phase oscillation signals QP-QN are precisely adjusted while the amplitude is maintained to be constant.

In this manner, the phase relationship of the oscillation signals generated by the quadrature voltage controlled oscillator of FIG. 4 is automatically adjusted precisely by monitoring the phase relationship between the resulting in-phase and quadrature-phase output signals IFI and IFQ. With such precise adjustment, the phase relationship between the in-phase and quadrature-phase oscillation signals and in turn between the in-phase and quadrature-phase output signals is maintained to be substantially 90°. With such a quadrature phase relationship, the receiver using such oscillation signals has the image signals effectively eliminated.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A quadrature voltage controlled oscillator, comprising:
   oscillation circuits for generating at least one in-phase oscillation signal and at least one quadrature-phase oscillation signal that are used to generate an in-phase output signal and a quadrature-phase output signal by mixing a RF (radio frequency) signal with the in-phase and quadrature-phase oscillation signals; and
   a compensation circuit that adjusts biasing in the oscillation circuits depending on a phase relationship between the in-phase and quadrature-phase output signals generated after mixing the RF signal with the in-phase and quadrature-phase oscillation signals.

2. The quadrature voltage controlled oscillator of claim 1, wherein the biasing in the oscillation circuits is adjusted by the compensation circuit to set a phase difference between the in-phase and quadrature-phase output signals to be substantially 90°.

3. The quadrature voltage controlled oscillator of claim 1, wherein the oscillation circuits include a first oscillation circuit for generating differential in-phase oscillation signals and a second oscillation circuit for generating differential quadrature-phase oscillation signals.

4. The quadrature voltage controlled oscillator of claim 3, further comprising:
   a first current source that generates a first bias current for the first oscillation circuit; and
   a second current source that generates a second bias current for the second oscillation circuit;
   wherein the compensation circuit adjusts the first and second bias currents.

5. The quadrature voltage controlled oscillator of claim 4, wherein the first and second bias currents are adjusted complimentarily.

6. The quadrature voltage controlled oscillator of claim 5, wherein the compensation circuit includes:
   a phase mismatch detector that determines a phase difference between the in-phase and quadrature-phase output signals; and
   means for complimentarily adjusting the first and second bias currents until the phase difference between the in-phase and quadrature-phase output signals is substantially 90°.

7. A wireless receiver, comprising:
   a down converter for generating an in-phase output signal and a quadrature-phase output signal by mixing at least one in-phase oscillation signal and at least one quadrature-phase oscillation signal with a RF (radio frequency) signal; and
   a quadrature voltage controlled oscillator including:
      oscillation circuits for generating the at least one in-phase oscillation signal and the at least one quadrature-phase oscillation signal; and
      a compensation circuit that adjusts biasing in the oscillation circuits depending on a phase relationship between the in-phase and quadrature-phase output signals generated after mixing the RF signal with the in-phase and quadrature-phase oscillation signals.

8. The wireless receiver of claim 7, wherein the biasing in the oscillation circuits is adjusted by the compensation circuit to set a phase difference between the in-phase and quadrature-phase output signals to be substantially 90°.

9. The wireless receiver of claim 7, wherein the oscillation circuits include a first oscillation circuit for generating differential in-phase oscillation signals and a second oscillation circuit for generating differential quadrature-phase oscillation signals.

10. The wireless receiver of claim 9, wherein the quadrature voltage controlled oscillator further includes:
   a first current source that generates a first bias current for the first oscillation circuit; and
   a second current source that generates a second bias current for the second oscillation circuit;
   wherein the compensation circuit adjusts the first and second bias currents.

11. The wireless receiver of claim 10, wherein the first and second bias currents are adjusted complimentarily.

12. The wireless receiver of claim 11, wherein the compensation circuit includes:
 a phase mismatch detector that determines a phase difference between the in-phase and quadrature-phase output signals; and
 means for complimentarily adjusting the first and second bias currents until the phase difference between the in-phase and quadrature-phase output signals is substantially 90°.

13. A method for generating oscillation signals, comprising:
 generating at least one in-phase oscillation signal and at least one quadrature-phase oscillation signal that are used to generate an in-phase output signal and a quadrature-phase output signal by mixing a RF (radio frequency) signal with the in-phase and quadrature-phase oscillation signals; and
 adjusting biasing during the generation of the in-phase and quadrature-phase oscillation signals depending on a phase relationship between the in-phase and quadrature-phase output signals generated after mixing the RF signal with the in-phase and quadrature-phase oscillation signals.

14. The method of claim 13, further comprising:
 setting a phase difference between the in-phase and quadrature-phase output signals to be substantially 90° from the adjusting of the biasing during the generation of the in-phase and quadrature-phase oscillation signals.

15. The method of claim 13, further comprising:
 generating differential in-phase oscillation signals and generating differential quadrature-phase oscillation signals.

16. The method of claim 15, further comprising:
 adjusting a first bias current used for the generation of the differential in-phase oscillation signals; and
 adjusting a second bias current used for the generation of the differential quadrature-phase oscillation signals.

17. The method of claim 16, further comprising:
 adjusting the first and second bias currents complimentarily.

18. The method of claim 17, further comprising:
 determining a phase difference between the in-phase and quadrature-phase output signals; and
 adjusting the first and second bias currents complimentarily until the phase difference between the in-phase and quadrature-phase output signals is substantially 90°.

* * * * *